United States Patent

Brojdo

[15] 3,676,715

[45] July 11, 1972

[54] SEMICONDUCTOR APPARATUS FOR IMAGE SENSING AND DYNAMIC STORAGE

[72] Inventor: Samuel Brojdo, Westfield, N.J.

[73] Assignee: Bell Telephone Laboratories, Incorporated, Murray Hill, N.J.

[22] Filed: June 26, 1970

[21] Appl. No.: 50,198

[52] U.S. Cl.........................307/304, 317/235 R, 317/235 N, 317/235 D, 340/173 LS

[51] Int. Cl.........................................H01l 11/14, H01l 15/00

[58] Field of Search...............317/235; 313/65 AB; 307/204; 340/173, 173 CA; 250/211 J

[56] References Cited

UNITED STATES PATENTS

| | | | |
|---|---|---|---|
| 3,400,273 | 9/1968 | Horton | 317/235 |
| 3,623,026 | 11/1971 | Engeler et al. | 317/235 |
| 3,206,670 | 9/1965 | Atalla | 317/235 |
| 3,453,507 | 7/1969 | Archer | 317/235 |
| 3,523,190 | 8/1970 | Goetzberger et al. | 317/235 |
| 3,576,392 | 4/1971 | Hofstein | 317/235 |

*Primary Examiner*—Jerry D. Craig
*Attorney*—R. J. Guenther and Arthur J. Torsiglieri

[57] ABSTRACT

Semiconductor apparatus for use in image sensing and/or dynamic storage applications. The apparatus includes a matrix of basic functional elements, each element including an MIS surface portion and an underlying PN junction. Conduction paths associated with each row and column of the matrix enable interrogation of the basic elements in either word organized or bit organized fashion. In operation, minority carriers are temporarily stored in surface inversion layers associated with each MIS portion after having been photogenerated or electronically injected from the underlying PN junction. Interrogation is accomplished by removing the voltage across an MIS portion to release the stored minority carriers and reverse-biasing the underlying junction to collect the released carriers.

13 Claims, 23 Drawing Figures

INVENTOR
S. BROJDO
BY A. J. Torsiglieri
ATTORNEY

SEMICONDUCTOR APPARATUS FOR IMAGE SENSING AND DYNAMIC STORAGE

BACKGROUND OF THE INVENTION

This invention relates to semiconductor apparatus adapted for use in solid state imaging and/or dynamic memory applications.

Heretofore, devices generally available for sensing optical images and converting them into electrical signals have employed electron beam scanning. Such devices suffer from several inherent limitations, among which are relatively large size and relative fragility inasmuch as delicate, evacuated glass envelopes usually have been employed.

As techniques for fabricating monolithic integrated circuits have advanced and integrated circuit costs have decreased, a growing interest in solid state imaging systems has become evident. Also evident today is a high degree of interest in semiconductive memory systems, particularly of the dynamic type. Although by definition dynamic memories are volatile and must be "refreshed" periodically to avoid loss of stored information, they nevertheless appear attractive because they are potentially less expensive than other forms of semiconductive memories.

SUMMARY OF THE INVENTION

An object of this invention is an inexpensive, readily integrable semiconductive image system which is both rugged and more compact than prior art devices which employ an electron beam.

A further object of this invention is to provide a dynamic memory array and new and improved methods of dynamic memory operation.

To these and other ends, semiconductive apparatus in accordance with my invention includes at least one basic element which includes a metal-insulator-semiconductor (MIS) surface portion and an underlying rectifying barrier, which barrier typically is a PN junction. Typically, the semiconductive portion of the MIS structure is electrically and physically common with the semiconductive material comprising one side of the PN junction.

For operation as a light detecting device the metallic portion of the MIS structure (which need not be metallic, merely conductive) is made semitransparent and a voltage is applied across the MIS structure to deplete the semiconductive portion near the semiconductor-insulator interface. Light incident upon the device generates minority carriers which are drawn toward the semiconductor-insulator interface by the electric field in the depletion region. At the interface they form an inversion layer where they can be stored for relatively long times (of the order of a second or longer).

The apparatus is interrogated by reverse-biasing the underlying PN junction and removing the applied voltage from the MIS structure. In this condition, the electric field attracting the minority carriers toward the interface disappears and the carriers are freed to diffuse away from the interface. As the carriers approach the depletion region associated with the reverse-biased PN junction, they are swept across the junction and can be detected by a sensing circuit in series with the junction.

In this mode of operation, the number of carriers accumulated at the semiconductor-insulator interface and the number of carriers collected by the PN junction will be proportional to the intensity of the incident light; and, accordingly, the amplitude of the detected signal will also be proportional to the incident light intensity.

In operation as a dynamic memory element, of course, the metallic portion of the MIS structure need not be semitransparent. A logical "1" is written by forward-biasing the PN junction and injecting carriers into the depletion region of the MIS portion to form the inversion layer. A logical "0" is represented by the absence of minority carriers in the MIS portion. Thus, a logical "0" is written simply by applying a voltage across the MIS portion to form a depletion region. Inasmuch as about a second or longer is required to fill the depletion region with minority carriers by thermal generation, a logical "0" must be rewritten periodically to avoid loss of stored information. Interrogation of the memory is accomplished in the same manner as interrogation in the light sensing mode described above.

In the preferred embodiments of my invention a plurality of the basic elements are disposed in an array for use as an image sensor and/or a dynamic memory. Typically, the array comprises a matrix including a plurality of the MIS portions disposed in rows and columns. The underlying rectifying barriers typically are disposed such that each underlies and is common to all or part of the MIS devices in each given row or column. Conduction paths associated with each row and column of the matrix enable interrogation of the basic elements in either word-organized or bit-organized fashion.

In the presently preferred embodiment of my invention, the apparatus comprises a semiconductive bulk portion of a first type semiconductivity which includes a plurality of elongated zones of the other type semiconductivity. A layer of the first type semiconductivity is disposed over and contiguous with the bulk portion such that the surface of the layer is a surface of a semiconductive wafer, the layer being of thickness substantially less than a diffusion length for minority carriers in the layer. A plurality of MIS devices are disposed in rows and columns over the elongated zones in such manner that the layer provides a common semiconductive portion for all of the MIS devices. Each column of MIS devices is disposed over a common one of the elongated zones which act as the column conduction paths. A plurality of semitransparent row conduction paths provide a common electrical contact to the metal portion of each of the MIS devices in a given row. Of course, for dynamic memory operation in which the array need not be photosensitive, the row conduction paths need not be semitransparent. A plurality of low resistance electrical contacts separately provide electrical contact to each of the rectangular zones; and a separate electrical contact is made to the semiconductive portion of first type semiconductivity.

In operation, the PN junction associated with each elongated zone provides the collection and injection function for each of the MIS devices in the column overlying that elongated zone. A plurality of modes of operation are possible; and illustrative ones are described in detail hereinbelow. A particularly unique mode of operation which involves indirect biasing and which I have termed the Base Depletion Mode also is described.

BRIEF DESCRIPTION OF THE DRAWING

The invention will be better understood from the following more detailed description taken in conjunction with the accompanying drawing in which.

It will be appreciated by those in the art that the figures have not necessarily been drawn to scale, but that certain portions have been exaggerated in relative size for simplicity of illustration and clarity of explanation.

DETAILED DESCRIPTION

Figure 1:
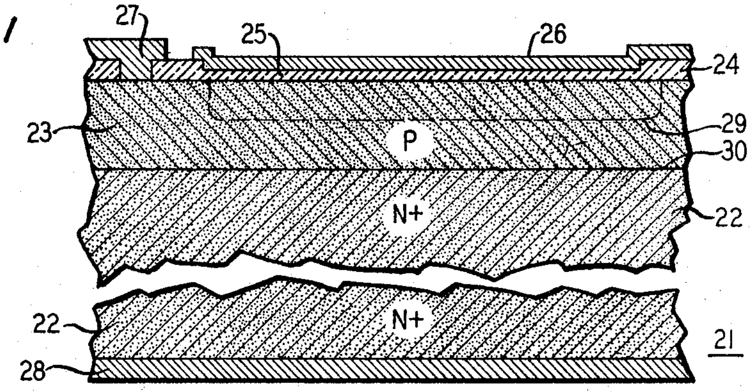
FIG. 1 shows a cross-sectional view of a basic element for use in accordance with my invention.

With more specific reference now to the drawing, FIG. 1 shows a cross-sectional view of a typical basic functional element 21, a plurality of which, in accordance with my invention, advantageously are disposed in rows and columns to achieve the aforementioned objects. As shown, element 21 includes a bulk portion 22 of a first type semiconductivity (shown here illustratively as $N^+$-type) and an overlying layer 23 of the other type semiconductivity (P-type), a PN junction 30 being formed therebetween. The surface of layer 23 is adapted to provide a surface of the semiconductive portion of element 21. An insulating layer having relatively thick portions 24 and relatively thin portions 25 overlies and is contiguous with the surface of layer 23. A control electrode 26 (which is semitransparent if photosensitivity is desired and which otherwise can be opaque) overlies most or all of the thin portion 25 of the insulating layer and additionally extends over the thicker portion 24 of the insulating layer. Electrodes 27 and 28 provide low resistance contact to layer 23 and to bulk portion 22, respectively.

It is presently contemplated that devices in accordance with my invention will be fabricated primarily of silicon using any of the well-known silicon fabrication technologies. Accordingly, for example, it is expected that layer 23 typically will be an epitaxial layer deposited upon a monocrystalline semiconductive substrate 22 and that the insulating layer typically will be silicon oxide, silicon nitride, aluminum oxide, or some combination of these insulators and/or other insulators which are or may become preferred in the silicon art. Also, metallic electrodes 27 and 28 may be fabricated of any metal or combination of metals convenient and well known to the worker in the art. As will be described in more detail hereinbelow, electrode 26 is a "field plate" control electrode (analogous to the gate electrode of an insulated gate field effect transistor), and, as such, need not be metallic but merely suitably conductive. However, for applications in which element 21 is to be photosensitive, electrode 26 must be at least semitransparent (ideally 100 percent) transparent, and may be fabricated, for example, using very thin layers of chromium, nichrome, and/or gold, for example, about 100 A. in total thickness. It is also expected that indium oxide, layers of which exhibit very high optical transmission coefficients, may be used, typically of a thickness of about 0.5 micron (5,000 A.).

Operation of the basic element shown in FIG. 1 will now be described with reference to the energy band diagrams shown in FIGS. 2A–2C.

Figure 2A:
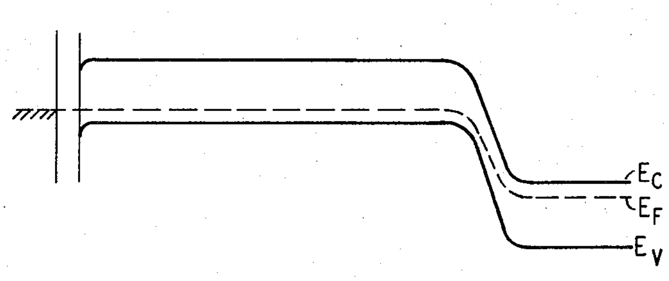
FIGS. 2A–2C are energy band diagrams depicting the basic modes of operating the device of FIG. 1 in accordance with my invention.
Figure 2B:
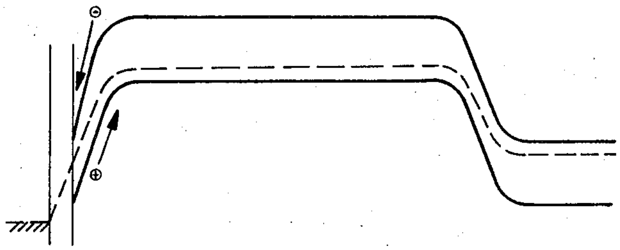
Figure 2C:
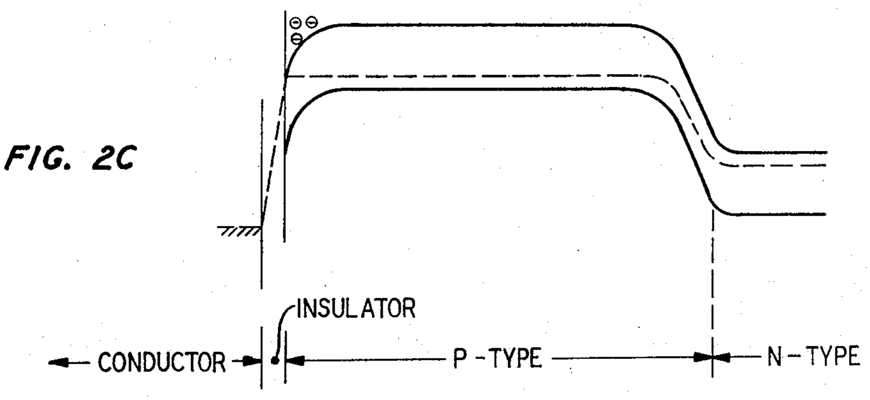

FIGS. 2A–2C depict energy band diagrams for the structure shown in FIG. 1. In accordance with conventions commonly employed in the art, positive voltage and positive energy are represented as increasing downward in the figures. From left to right in FIGS. 2A-2C are represented the relevant energy levels in the control electrode 26, thin insulator 25, P-type semiconductive layer 23, and $N^+$-type bulk portion 22. In the semiconductive portions the lower edge of the conduction band (denoted $E_C$), the upper edge of the valence band (denoted $E_V$) and the Fermi level (illustrated by the broken line and denoted $E_F$) are shown. The approximate position of the Fermi level is shown in the insulating and metallic portions.

FIG. 2A represents the energy band diagrams for the condition in which control electrode 26 and layer electrode 27 both are connected to the same potential; and electrode 28 (connected to bulk portion 22) is at some more positive potential. In this condition the $PN^+$ junction formed between the layer and the substrate is reverse-biased, as indicated by the bending of the energy bands and the Fermi level. Away from the junction the energy bands extend substantially unperturbed to the interface between the semiconductive portion and the insulating layer 25.

FIG. 2B represents the energy band configuration immediately following application of a positive voltage to control electrode 26 relative to electrode 27 while PN junction 30 is maintained reverse-biased. Note the severe energy band bending near the interface between semiconductive layer 23 and the insulating layer 25. This is a well-known nonequilibrium depletion condition (represented by broken line feature 29 in FIG. 1) caused by the temporary lack of available minority carriers (in this case, electrons) near the interface. It is also well known that a relatively long time (typically of the order of a second or more) may elapse before a sufficient number of electrons can be thermally generated in and near the depletion region to achieve the equilibrium condition of inversion to N-type near the semiconductor-insulator interface. This equilibrium inversion condition in which the Fermi level is essentially at the edge of the conduction band at the semiconductor-insulator interface and in which the surface portion of the semiconductor has been inverted to N-type conductivity is shown by the energy band diagram in FIG. 2C.

It should be observed that in both conditions represented by FIGS. 2B and 2C the electric field in the depletion region is of polarity so as to attract generated electrons (minority carriers) toward the semiconductor-insulator interface. Consider now the operating condition depicted by FIG. 2B immediately after application of a positive voltage to control electrode 26. In this condition, if the surface of the device is illuminated, photon absorption results in electron-hole pairs being photogenerated in the silicon underneath semitransparent electrode 26. All the pairs generated inside the depletion region near the semiconductor-insulator interface are separated by the electric field existing therein, the electrons being swept toward the interface. Of course, the depletion region associated with reverse-biased PN junction 30 also acts to pull electrons toward junction 30. However, if layer 23 is as thick as or thicker than an absorption length of the incident light in the semiconductive material, substantially all of the photogenerated electrons can be made to accumulate in the surface depletion region underneath electrode 26.

Consider again FIG. 2B after an amount of time has passed such that some electrons have accumulated in the depletion region; and suppose that at that time the potential applied to control electrode 26 is abruptly returned to the same voltage as applied to layer electrode 27. In this condition the energy bands return to the state depicted in FIG. 2A, which necessarily means that the electric field attracting the electrons to the metal semiconductor interface disappears. Accordingly, all the accumulated electrons begin moving away from the semiconductor-insulator interface by diffusion. As the electrons diffuse down through layer 23, the reverse-biased $PN^+$-junction acts as the base-collector junction in a bipolar transistor. Accordingly, those electrons which diffuse across the layer are swept across the depletion region associated with the $PN^+$-junction; and a resulting current flows through appropriate circuitry connected between electrodes 27 and 28. This current can be detected by a sensing circuit disposed advantageously in series with bulk portion 22, i.e., connected in series with electrode 28. Because the electrons were accumulated over a period of time, this detected current is proportional to the intensity of the incident light and to the length of time the electrons were allowed to accumulate, i.e., the device operates in a charge integration mode.

Inasmuch as the surface inversion layer can be thought of as acting as an emitter capable of emitting a limited number of accumulated minority carriers and the PN$^+$-junction can be thought of as acting as a base-collector junction with the layer as base and the substrate as collector, this basic functional element will be termed an "Inversion Layer Emitter Transistor" (ILET). In many respects, ILET is a fortuitous acronym for this device, because ILET connotes "eyelet," which, in turn, connotes a small eye-like element capable of detecting light.

At this point, it should be noted that for photosensitive operation the device of FIG. 1 is subject to potentially conflicting constraints, as are most physical systems. On the one hand, layer 23 should be substantially thinner than a diffusion layer for minority carriers, so that once electrons are released from the surface depletion region substantially all are collected by the underlying PN junction. On the other hand, for optimum operation, layer 23 should be substantially thicker than an absorption length for light, as mentioned hereinabove. Fortunately, for the applications of presently greatest interest where the incident light is in the visible range and the semiconductor is silicon, a diffusion length in silicon typically is about 1 mil (about 25 microns) and an absorption length is less than about 3 microns. So it is seen that the constraints are not, in fact, conflicting. Rather, one has a substantial range of layer thicknesses, e.g., about 3 to 25 microns, within which to vary the layer thickness. Of course, the layer need not actually be thicker than an absorption length for an ILET to be operative. If the layer is thinner, e.g., 1 micron, some portion of the photogenerated charge will be swept directly across the PN junction and, accordingly, will not be detected. This implies that the quantum efficiency would be deleteriously affected, but the ILET would nevertheless be operative.

The basic ILET structure of FIG. 1 also can be operated as a dynamic memory, in which case control electrode 26 need not be semitransparent. For memory operation, a logical "0" can be represented in an ILET by the MIS portion being in the nonequilibrium depletion condition and a logical "1" can be represented by the semiconductive surface portion of the ILET being completely or nearly inverted to the other type conductivity.

To write a "0" into an ILET, a voltage is applied across the MIS portion to create the nonequilibrium depletion region. To write a "1," the underlying PN junction is forward-biased to inject minority carriers across the base of the ILET and into the depletion region to produce the inverted condition. Interrogation, i.e., reading, is accomplished in the same manner as described above with reference to operation as a light detector.

Figure 3:
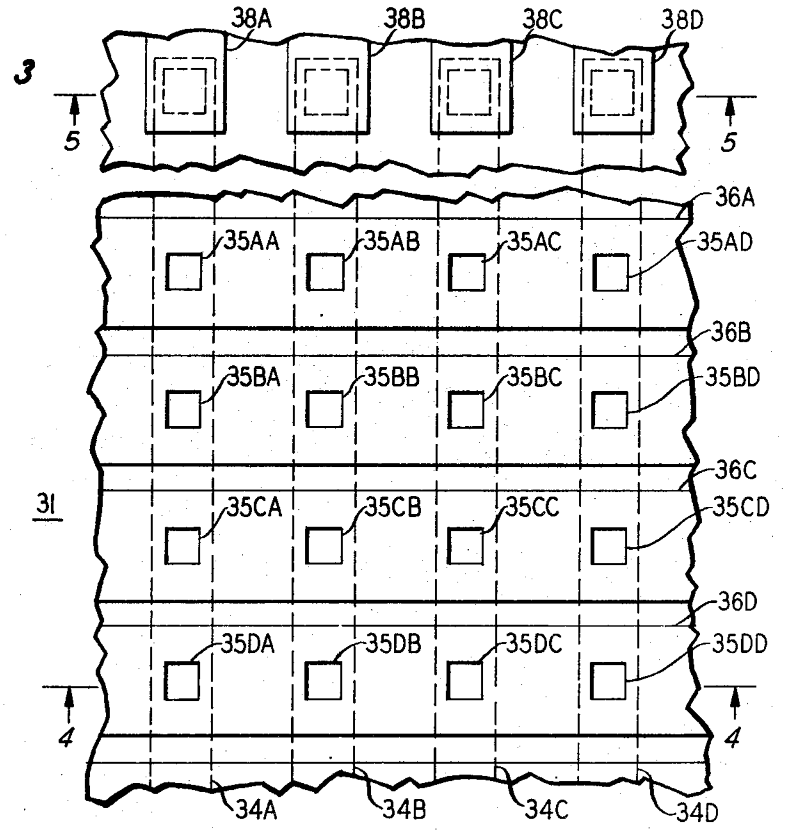
FIG. 3 is a schematic plan view of a portion of an array in accordance with the presently preferred form of my invention.
Figure 4:
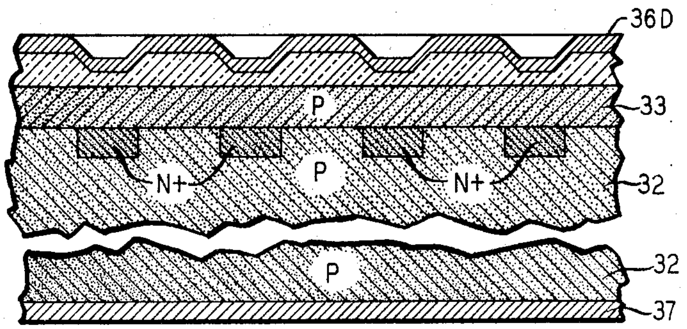
FIGS. 4 and 5 are cross-sectional views taken along the lines 4—4 and 5—5, respectively, in FIG. 3.
Figure 5:
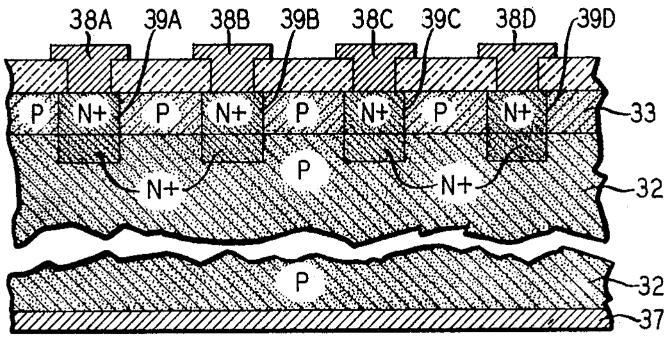

Having described the operation of the basic ILET structure 21 of FIG. 1 as a light-sensing element and as a dynamic memory element there will now be described an array of such basic elements for use advantageously as an optical image sensor in accordance with the presently preferred embodiment of my invention. To this end, FIG. 3 shows a plan view of a portion 31 of the preferred array; and FIGS. 4 and 5 are cross-sectional views taken along lines 4—4 and 5—5, respectively, in FIG. 3. Common reference numerals are used to identify corresponding elements within the three figures.

As shown, the semiconductive portion of the array includes a P-type semiconductive bulk portion 32 and an overlying P-type layer 33. Relatively long rectangular N$^+$-type collector strips 34A–34D are formed into the P-type bulk portion 32 prior to forming layer 33. Alternatively, the N$^+$-type strips can be formed by ion implantation either before or after layer 33 is formed. Each N$^+$ strip is therefore buried in P-type material. The thin insulating areas of the ILETs are shown as broken-line rectangles 35AA–35AD, 35BA–35BD, etc. through 35DA–35DD. Except for the thin insulating areas, the rest of the semiconductive surface is covered by relatively thicker insulating layer, as in FIG. 1. Horizontal strips 36A–36D of semitransparent conductive material are disposed over the thin insulating portions and, additionally, over most of the area there surrounding. It will be appreciated that each thin insulating area and the semiconductive portion thereunderlying comprises a basic ILET of the type hereinbefore defined.

The P-type material (bulk portion 32 and layer 33) serves as a common base for all the ILETs and advantageously is contacted electrically through the back of the semiconductive wafer by an electrode 37. It should be observed that it is of little or no consequence whether the contact between electrode 37 and P-type bulk portion 32 is rectifying or ohmic because the PN$^+$-junctions will be maintained reverse-biased throughout the operation as an image sensor. Hence, any rectifying barrier formed with electrode 37 will be maintained forward-biased at all times.

Each buried collector strip 34A–34D is separately contacted outside the ILET array by electrodes 38A–38D, respectively, each making low resistance electrical contact through N$^+$-type zones 39A–39D which are formed through layer 33 to intersect separately the strips 34A–34D, as shown in FIGS. 3 and 5.

In operation as an image sensor, the collecting junctions formed between the N$^+$-type zones 34A–34D and the surrounding P-type material are reverse-biased and all the semitransparent conductive strips 35A–36D are biased positive with respect to the P-type portions. The operating condition, then, in each of the ILETs is as depicted in energy band diagram FIG. 2B. Photogenerated electrons are drawn by the electric fields in the depletion regions under the thin insulating portions of each ILET and accumulate near the semiconductor-insulator interface under the closest thin insulating portion to which they are generated.

It should be observed that a depletion region also exists under the thicker insulating portions covered by the semitransparent conductors. Of course, this depletion region does not extend as far into the semiconductor as does that under the thin insulators but it is sufficient to attract photogenerated electrons toward the interface. Once attracted to the interface under the thicker insulator, they are swept into the depletion regions under the ILETs where the electric fields are stronger than under the thick insulators. Thus, it will be appreciated that nearly 100 percent of the area of the ILET array is photosensitive, the only non-photosensitive portions of the surface being those between the transparent conductive strips. This fact, of course, contributes to the total quantum efficiency of the image sensor.

To interrogate and detect the amount of charge photogenerated in and near each ILET in the array, the potential of any one of the horizontal conductors 36A–36D is reduced sufficiently to collapse the depletion regions in all ILETs associated with that conductive strip. Because layer 33 is made substantially thinner than a diffusion length, the carriers thus emitted by each depletion region diffuse primarily toward and are primarily collected by the PN$^+$ junction associated with the N$^+$-type conductive strip immediately thereunderlying. The collection of the emitted carriers is detected by a plurality of sensing amplifiers one of which is in series with each separate N$^+$-type strip, i.e., detection circuits connected to electrodes 38A–38D.

The aforedescribed interrogation scheme is, of course, a word-organized scheme, inasmuch as an entire row of ILETs are read out simultaneously in parallel. If, as in many present day optical imaging systems, it is desired sequentially to scan each individual photosensitive element using only one sensing amplifier, the row of signals simultaneously appearing on each of the conductors 38A–38D can be stored in specially adapted storage elements which can, in turn, be scanned sequentially as desired.

Figure 6:
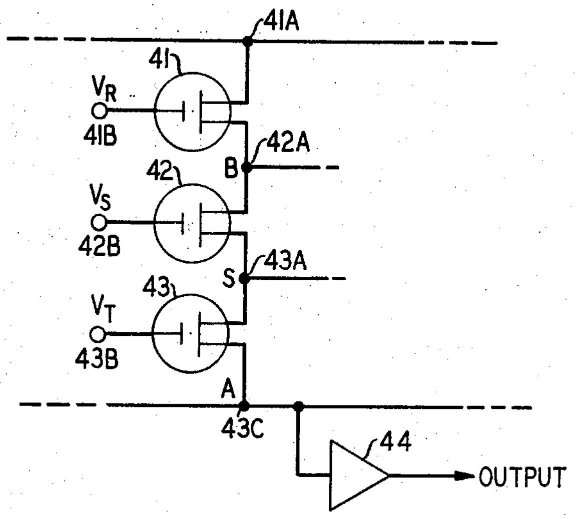
FIG. 6 is a schematic circuit representation of a portion of a suggested scheme for enabling sequential scanning of an array such as shown in FIG. 3.

A rudimentary example illustrating how this sequential scanning can be performed is illustrated in FIGS. 6 and 7A–7D. FIG. 6 shows a charge transfer circuit consisting of three series-connected N-channel insulated gate field effect transistors (IGFETs) which can conveniently be formed in the P-type layer material described with reference to FIGS. 3–5. One such circuit, as shown in FIG. 6, would be associated with each N$^+$-type collector strip 34A–34D.

Figure 7A:
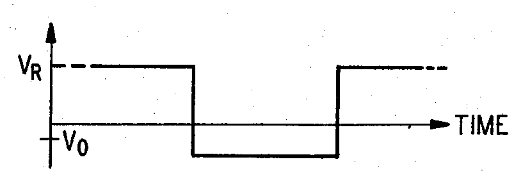
FIGS. 7A–7D are waveform diagrams depicting the relative voltages and timing intervals which can be applied to effect operation of the circuit shown in FIG. 6.
Figure 7B:
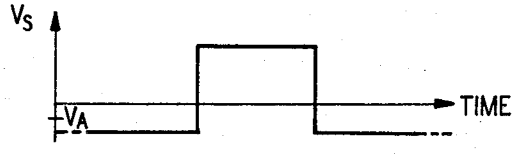
Figure 7C:
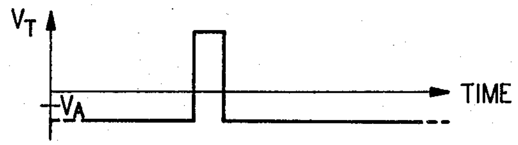
Figure 7D:
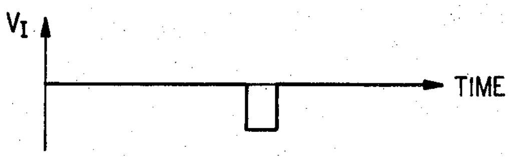

As shown in FIG. 6, the charge transfer circuit includes three N-channel IGFETs 41, 42, and 43 connected in series with respective gate electrodes 41B, 42B, and 43B adapted for connection to separate pulsed potentials $V_R$, $V_S$, and $V_T$, the waveforms for which are shown in FIGS. 7A–7C. FIG. 7D depicts the waveform of the voltage applied to any one of the semitransparent conductive strips 36A–36D (in FIG. 3) to cause read-out of a word of information from the ILET array onto the $N^+$-type conductive strips 34A–34D to which the plurality of charge transfer circuits, such as shown in FIG. 6, are connected.

To illustrate the operation of the circuit of FIG. 6, node 42A, between IGFETs 41 and 42, would be connected to one of the buried $N^+$-type conductive strips. Node 41A is connected to a source of constant potential $V_0$. As shown in FIG. 7A, the potential $V_R$ applied to gate electrode 41B normally is more positive than $V_O$, so that the IGFET 41 normally is turned on, thereby clamping the potential of node 42A (and, accordingly, of the $N^+$-type strip connected thereto) to $V_O$ through the channel of IGFET 41. The potentials $V_S$ and $V_T$ of gate electrodes 42B and 43B, depicted in waveform diagrams 74B and 74C, normally are maintained such that IGFETs 42 and 43 are turned off such that node 43A, a temporary storage node, is electrically floating. Node 43C connected to IGFET 43 is connected to the input of a low noise charge sensitive amplifier 44. The input to amplifier 44 is common to all of the circuits of the type shown in FIG. 6 connected to the array.

When it is desired to couple the contents of a given $N^+$-strip into the temporary storage node 43A, $V_R$ is made more negative than $V_O$, and $V_S$ and $V_T$ are made more positive than the potential at node 43C. In this condition, the potentials at nodes 42A and 43A are clamped through IGFETs 42 and 43 (which are now turned on) to the potential of node 43C. Thereafter, $V_T$ is returned to its standby level, turning off IGFET 43; and nodes 42A and 43A are electrically floating at a common potential. Then, $V_I$ (shown in FIG. 7D) is switched negative and is applied to one of the semitransparent row conductors 36A–36D in FIG. 3 to cause interrogation of a line of ILETs, which, in turn, causes the accumulated quantities of photogenerated charge to be collected and conducted through the $N^+$-type strips 34A–34D to establish unique potentials at nodes 42A and 43A. After the interrogation is complete and the potentials of nodes 42A and 43A have stabilized, $V_S$ is switched to its higher standby level turning off IGFET 42, and thus electrically disconnecting nodes 42A and 43A. After IGFET 42 is turned off, node 42A is again clamped to $V_O$ by returning $V_R$ to the standby voltage.

At this time, temporary storage node 43A is floating at a unique potential determined by the amount of charge discharged from the corresponding ILET. Remembering now that if a plurality of circuits of the type shown in FIG. 6 are connected to the ILET array and if the temporary storage nodes of each of the plurality has been charged by the word-organized read-out just performed, it will be appreciated that each of the temporary storage nodes 43A and each of the charge transfer circuits can be sequentially accessed and sequentially detected by sequentially applying a positive voltage to gate electrodes 43B to transfer the charges individually to the sense amplifier 44.

Turning now to dynamic memory operation, if one compares the array of FIG. 3 with the basic elemental ILET shown in FIG. 1, it will be appreciated that: the $N^+$ buried strips 34A–34D in FIG. 3 correspond to the $N^+$ substrate 22 in FIG. 1; the P-type material 32 and 33 in FIG. 3 is analogous to the P-type layer 23 in FIG. 1; and the analogies between the metallic and insulating portions are apparent. Recalling the dynamic memory mode of operation suggested with respect to FIG. 1 in which, inter alia, a logical "1" is written by forward biasing the underlying PN junction and injecting minority carriers (electrons) into the surface depletion region, it is not readily apparent how to operate the array of FIG. 3 as a dynamic memory because all the ILET "bases," i.e., layer 33, are at a common potential and each $N^+$-type strip 34A–34D is common to an entire column of the MIS storage structures, e.g., $N^+$-type strip 34A is common to the MIS structures identified by 35AA, 35BA, 35CA, and 35DA. Accordingly, if one simply forward biased the junction associated with strip 34A, a logical "1" would be written into the entire column of MIS devices thereoverlying, rather than selectively writing the logical "1" into a single MIS device, e.g., 35CA, as desired. However, I have discovered that the array of FIG. 3 can be operated as a selective dynamic memory in an "indirect-biased," Base Depletion Mode which is described immediately hereinbelow.

To understand the Base Depletion Mode of operation, consider the energy band diagrams depicted in FIGS. 8A–8F which, like FIGS. 2A–2C, are representative of the energy bands in the basic structure of FIG. 1 and in any individual ILET in any array. In FIGS. 8A–8F, $V_{g1}$ and $V_{g2}$ refer to voltages applied to the control electrodes (26 in FIG. 1, 36A–36D in FIG. 3), and $V_C$ refers to the voltage applied to the $N^+$-type collectors (22 in FIG. 1, 34A–34D in FIG. 3) of the ILETs, both voltages measured with respect to the potential of the bases (23 in FIG. 1, 33 in FIG. 3) which may be at any constant potential but which will be assumed to be at ground potential (zero voltage) for the purpose of the following discussion.

Recalling that a logical "0" is stored in an ILET if the MIS portion of the device is in the nonequilibrium depletion condition and that a logical "1" is stored if the semiconductive surface portion of the MIS portion of the ILET is completely or nearly inverted to the other type semiconductivity, let us turn now to the Base Depletion Mode of operation.

Consider an ILET with a relatively thin base layer of relatively high resistivity. With sufficiently high voltage $V_{g1}$ applied across the MIS portion of the ILET, the nonequilibrium depletion region can be made to extend completely through the base layer to intersect the depletion region associated with the underlying $PN^+$ junction. This condition is depicted in FIG. 8A which shows the energy band diagram of an ILET with zero voltage applied to the base layer and to the collector and with $V_{g1}$ applied to the gate electrode of the MIS portion.

Figure 8A:
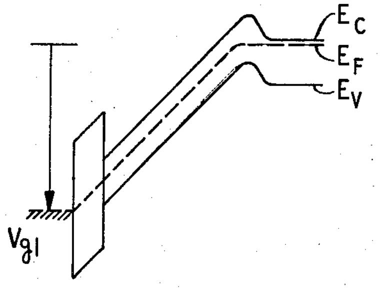
FIGS. 8A–8F are energy band diagrams depicting the mode of operating a structure such as shown in FIG. 3 as a dynamic memory in accordance with the presently preferred mode of operation.
Figure 8D:
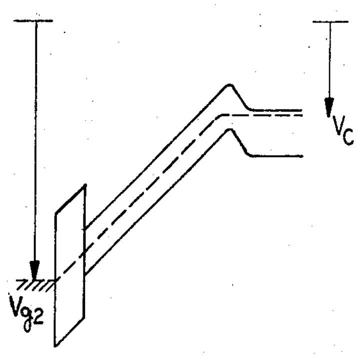
Figure 8B:
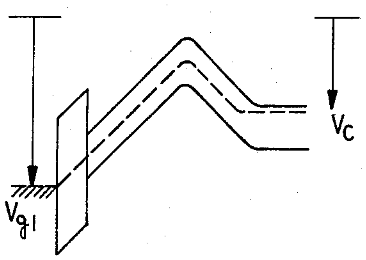

If now with $V_{g1}$ maintained, a reverse bias $V_C$ is applied to the $PN^+$-junction, the electric fields interact in the semiconductive portions such that the junction depletion region expands and the surface depletion region contracts; and the band diagrams become approximately as shown in FIG. 8B.

Note that in FIGS. 8A and 8B the depletion regions extend completely through that portion of the base layer underneath the thin insulating portion of the ILET so that the base portion of the ILET is effectively electrically disconnected and thus isolated from the surrounding base-layer material. Thus, the potential distribution within the base of the ILET is determined entirely by $V_{g1}$ and $V_C$.

Figure 8E:
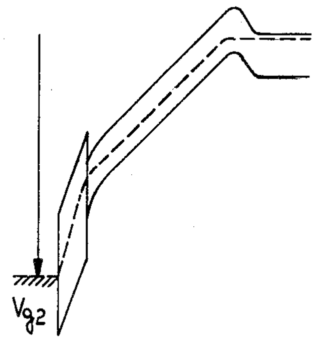
Figure 8C:
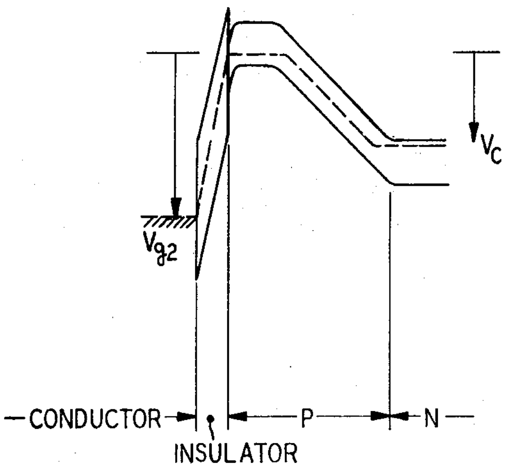

FIG. 8C shows the band diagrams as they appear with an applied gate voltage $V_{g1}$ and an applied collector reverse bias $V_C$ after a sufficient number of minority carriers have accumulated at the metal-insulator interface to achieve the equilibrium conductivity-inversion condition adjacent the interface. In this condition, the surface portion is N-type, as indicated by the Fermi energy being at about the same energy as the conduction band at the interface; and the remainder of the base layer is P-type except for that portion into which the junction depletion region extends.

It will be appreciated that FIG. 8C represents the condition in which a logical "1" is stored in the device. For reasons which will become apparent, FIGS. 8A and/or 8B will be considered to represent the condition in which a logical "0" is stored in the device.

Consider now the effect of applying an increased gate voltage $V_{g2}$ to a device previously in the condition represented by FIG. 8B. If $V_{g2}$ is approximately equal to or greater than $V_{g1}$ plus $V_C$, its effect will be to force the nonequilibrium surface depletion region completely through the layer to the $PN^+$ junction. This condition, which constitutes at least a partial removal of the reverse bias from the $PN^+$-junction, is represented in FIG. 8D (which illustrates complete removal of the reverse bias).

If the applied junction reverse bias is switched to zero while $V_{g2}$ is applied, the band energies become as shown in FIG. 8E. In this condition the junction has become forward-biased by the indirect action between the control electrode voltage and junction voltage; and so the junction injects minority carriers into the P-type layer. These injected carriers are swept across the layer and accumulate at the semiconductor-insulator interface, thus tending to form the inversion condition. Then, after the gate voltage is returned to $V_{g1}$ and the junction voltage is returned to $V_C$, the ILET will be in the logical "1" state represented by FIG. 8C.

Figure 8F:
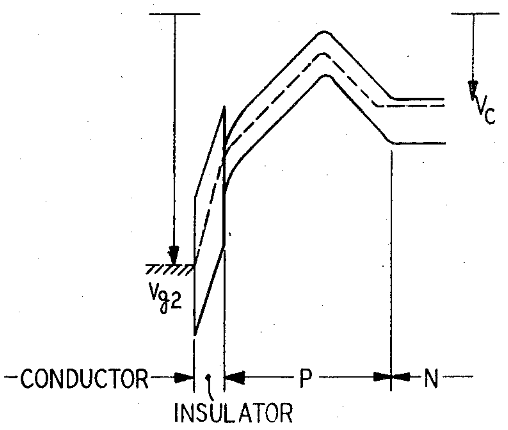

Note that with the device in the logical "1" state (FIG. 8C), if the gate voltage is alternately switched between $V_{g1}$ and $V_{g2}$ while the applied junction voltage is maintained constant at $V_C$, the band conditions will alternate between those shown in FIG. 8C and those shown in FIG. 8F with no deleterious effect on the stored logical "1" state. Similarly, if the applied junction voltage is alternated between $V_C$ and zero while the control electrode voltage is maintained constant at $V_{g1}$, the band energies at the right side of FIG. 8C will simply move up and down (representing varying degrees of reverse bias on the junction), again with no deleterious effect on the stored logical "1" state. Notice also with reference to FIG. 8B that the logical "0" state also is not affected by an independent change in either the gate voltage or the applied junction voltage while the other one of them is maintained constant.

In summary, then, only the simultaneous increase of $V_{g1}$ to $V_{g2}$ and reduction of applied junction reverse bias results in a "write 1" operation. Of course, a "write 0" operation can be accomplished simply by reducing $V_{g1}$ to zero and collapsing the surface depletion region to discharge any accumulated minority carriers and then re-applying $V_{g1}$ to create a surface depletion region.

It will be appreciated by those in the art that the MIS capacitance corresponding to a state "1" is different from that corresponding to state "0." Thus, a non-destructive read-out can be achieved simply by measuring the capacitance between the control electrode and the base layer of any ILET.

However, because of unavoidable thermal generation of hole-electron pairs, a destructive read-out is required periodically to "refresh" the logical "0" state of an ILET. That is, over a period of time (of the order of a second or longer), a nonequilibrium surface depletion region (logical "0") would accumulate sufficient electrons solely through unavoidable thermal generation to invert to the equilibrium surface inversion (logical "1"). Accordingly, the ILET must be destructively read out periodically; and, if a "1" was stored, it must be rewritten. This is what is referred to in the art as "refreshing" the state of a storage cell, and is, by definition, characteristic of all dynamic memories.

The operation of the array of FIG. 3 as a dynamic memory now should be readily understandable. Note that in the described Base Depletion Mode of operation the potential of the base layer was maintained always at a constant potential during the switching of $V_g$ and $V_C$ for writing and/or reading. Accordingly, in operation, the P-type base layer 33 and the P-type bulk portion 32 of FIGS. 3–5 conveniently can be always connected (through back electrode 37) to a constant reference potential, e.g., ground.

Initially, in operation, all the $N^+$ collector column strips 34A–34D are connected (through electrodes 38A–38D) to a positive potential $V_C$ to reverse bias all the junctions; and all the row conductor strips 36A–36D are connected to a positive potential $V_{g1}$ which sets the state of all the ILETs to logical "0." To write a "1" into one or more ILETs, e.g., 35BA and 35BD, in a given row, e.g., 36B, the potential on that row electrode 36B is switched to the more positive potential $V_{g2}$ while the potentials of the corresponding $N^+$ strips 34A and 34D are reduced to zero to force a "write 1" operation in the Base Depletion Mode. After the "write 1" operation is completed, the potential of the row electrode 36B is returned to $V_{g1}$; and the potential of the $N^+$ strips are all restored to $V_C$. Of course, to read out a word (row) of stored information, the potential of the selected row electrode is simply reduced from $V_{g1}$ to zero while $V_C$ is maintained on the $N^+$ strips; and read out proceeds as described with reference to the image sensing mode of operation.

Although an operative array of the type shown in FIGS. 3–5 can be made with widely varying parameters, the following sizes and resistivities are considered typical with present-day technologies. The $N^+$ strips 34A–34D are about 0.5–1.0 mil wide and can be diffused or ion implanted with phosphorous to a sheet resistivity of about 5 Ω/□. P-type layer 33 can be epitaxially deposited to a thickness of about 2–5 microns and a resistivity of about 1–10 ohm-centimeters. The thin insulating portions 35AA–35DD can be any of the thin, e.g., 1,000A., single dielectrics or multilayered dielectrics commonly used under gate electrodes of insulated gate field effect transistors (IGFETs).

Figure 9:
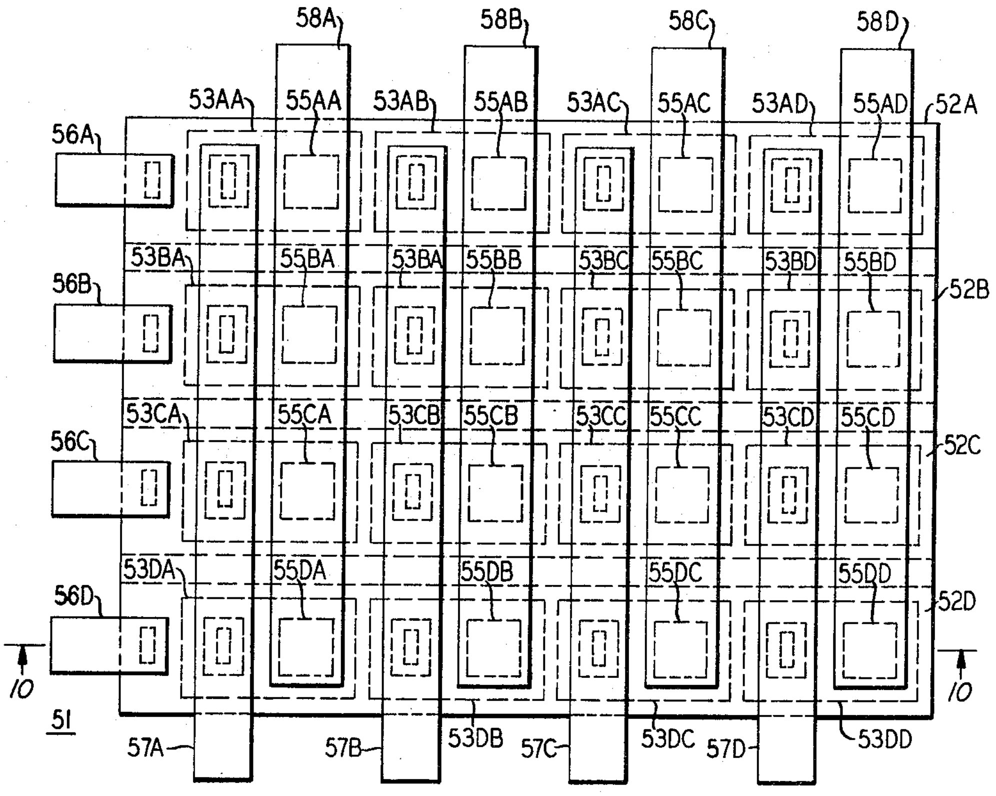
FIG. 9 shows a plan view of another array of devices in accordance with my invention for use in another mode of dynamic memory operation.
Figure 10:
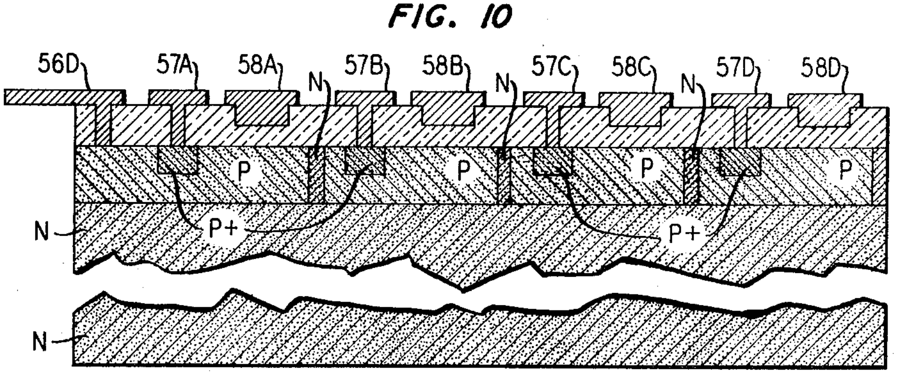
FIG. 10 is a cross-sectional view taken along lines 10—10 in FIG 9.

With reference now to FIGS. 9 and 10, there is illustrated a semiconductive array 51 of ILETs adapted for a mode of dynamic memory operation more straightforward than the Base Depletion Mode described hereinabove. Although as in all arrays suggested herein, a vast array, e.g., 1,000 by 1,000, of ILETs can be used, FIG. 9 shows a simple 4 by 4 array to enhance simplicity of illustration and clarity of explanation. The array includes a plurality of horizontal rectangular zones 52A–52D substanially of $N^+$-type conductivity, dielectrically isolated from each other, e.g., by air or solid dielectric. Each zone 52A–52D includes a plurality of P-type zones 53AA–53AD, 53BA–53BD, 53CA–53CD, and 53DA–53DD, surrounded by the $N^+$-type material and each including a $P^+$-zone 54AA–54DD to enable facile electrical connection to the P-type zones. Overlying each P-type zone 53AA–53DD is a thin insulating portion (represented by the broken line squares 55AA–55DD) of the ILET corresponding to each of the P-type zones. Electrodes 56A–56D provide low resistance electrical contact separately to each $N^+$-type strip 52A–52D. A plurality of pairs of conduction paths 57A and 58A, 57B and 58B, 57C and 58C, and 57D and 58D provide electrical access to the individual ILETs to enable selective reading and writing. Note that column conduction paths 57A–57D make electrical connection through the $P^+$-type zones (54AA–54DD) to the P-type zones (53AA–53DD) over which they pass. Column conduction paths 58A–58D provide common gate electrodes for the thin oxide regions 55AA–55DD over which they pass.

In operation, electrodes 57A–57D typically are at zero potential and electrodes 56A–56D and 58A–58D are at a positive potential so that all the PN junctions are reverse-biased and all the ILETs are in the "0" state.

To write a "1" into any particular ILET, e.g., 55CB, the potential of one of lines 57A–57D, in this example 57B, is raised sufficiently to remove part (typically about half) of the reverse bias from all the PN junctions associated with this line. Then, the potential of one of the lines 56A–56D, in this case 56C, is raised sufficiently to forward bias the junction associated with ILET 55CB but not sufficiently to forward bias the other ILETs associated with line 56C and other lines 57, e.g., 57A, 57C, and 57D. Forward biasing the junction under the thin insulating portion of 55CB causes injection of carriers into the surface depletion region under 55CB and the "write 1" thereby is accomplished. After the "write 1" is completed, the potential of line 56C is restored to its initial positive voltage; and the potential of line 57B is restored to zero. Word-organized read-out is accomplished by reducing the voltage on one of lines 58A–58D while maintaining all the junctions under that line reverse-biased for collection.

Figure 11:
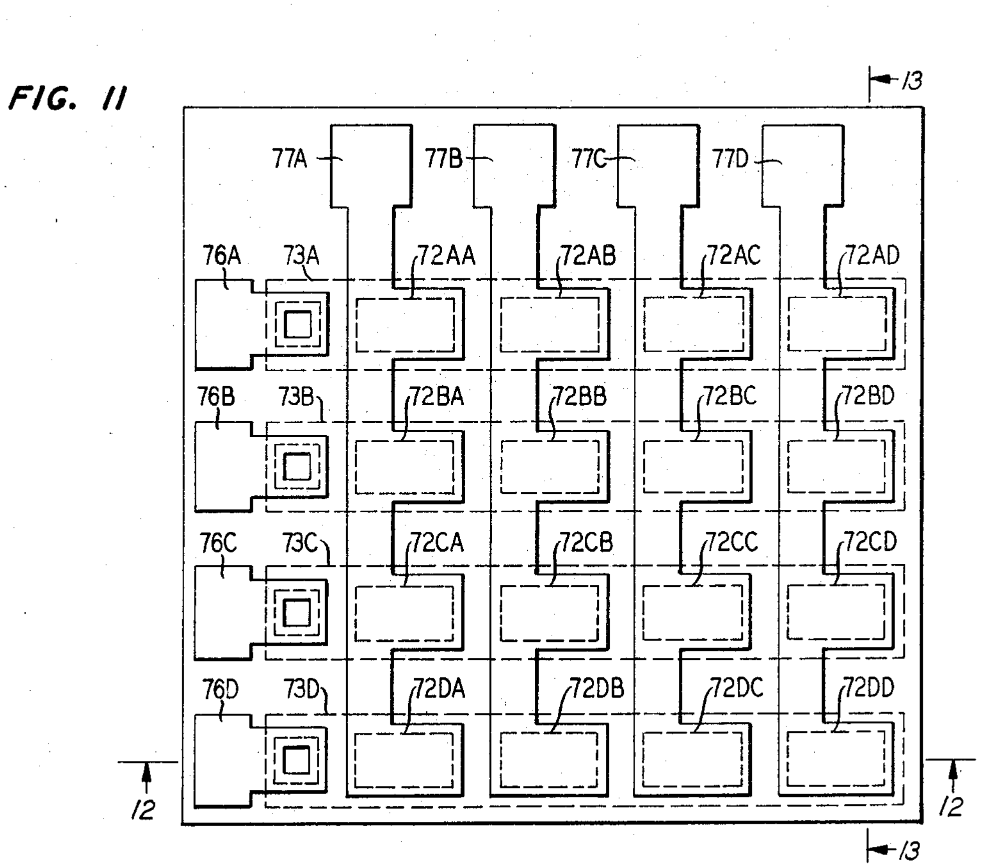
FIG. 11 is a plan view of still another array in accordance with my invention for use as an image sensor or a dynamic memory.
Figure 12:
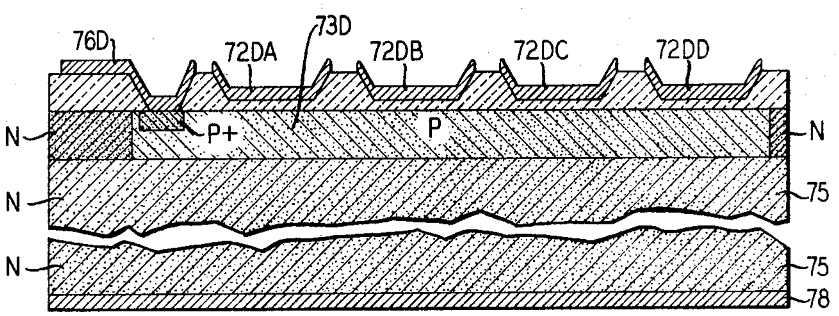
FIGS. 12 and 13 are cross-sectional views taken along lines 12—12 and 13—13 in FIG. 11.
Figure 13:
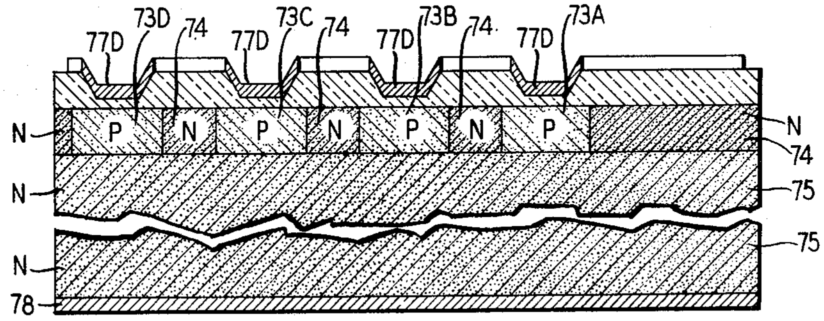

Turning now to the final embodiment to be described in detail, FIG. 11 shows a plan view and FIGS. 12–13 show cross-sectional views (taken on lines 12—12 and 13—13 in FIG. 11) of an array 71 of ILETs comprising a matrix of MIS devices disposed in rows over corresponding rows of $PN^+$-junctions. Each junction is common to the row of MIS devices under which it lies.

In FIG. 11, the broken-line rectangles 72AA–72DD represent the outer boundaries of the thin insulating portions of the individual MIS portions of each ILET. These thin insulating portions are disposed in rows over rectangular P-type zones 73A–73D which are surrounded by N-type isolation zones. More specifically, the structure includes an $N^+$-type bulk portion 75 over which there is deposited a P-type layer 73. N-type isolation zones 74 are formed, e.g., by diffusion or ion implantation, through layer 73 to delimit the rectangular zones 73A–73D. Each P-type row zone 73A–73D is contacted electrically by electrodes 76A–76D, respectively. Semitransparent conductive strips 77A–77D provide the control electrodes for and interconnect each ILET in a column. The N-type material 74 and 75 is contacted electrically by back electrode 78.

In operation, back electrode 78 advantageously is connected to a constant positive reference potential. Each row electrode 76A–76D is connected to a negative potential $V_C$ to reverse bias all the $PN^+$ junctions; and each column electrode 77A–77D is connected to a positive potential $V_g$ to form the nonequilibrium depletion regions within each ILET. In this condition, photogenerated charge is integrated in the depletion regions under each thin insulating region 72AA–72DD, as described with reference to FIG. 1.

This particular array (FIG. 11) has the advantage that each ILET can be conveniently scanned individually, as opposed to scanning an entire row at a time with the above-described arrays. To read out an individual ILET, e.g., 72AA, the potential of the row conductor 76A, corresponding to that ILET, is increased to zero and the potential of the column conductor is reduced to zero, thus collapsing the depletion region under the thin insulating portion of 72AA. None of the other ILETs are read out by this operation because ILET 72AA is the only one which has zero voltage between the semiconductive portion and the metal portion of the ILET.

Although my invention has been described in part by making detailed reference to certain specific embodiments, such detail is intended to be and will be understood to be instructive rather than restrictive. It will be appreciated by those in the art that many variations may be made in the structure and modes of operation without departing from the spirit and scope of my invention as disclosed in the teachings contained herein.

For example, certain features of my invention may be used to advantage for some applications without a corresponding use of other features. And, of course, semiconductivity types may be interchanged as desired, provided a corresponding reversal of voltage polarities also is made.

Still further, of course, the imaging arrays need not be limited to detecting visible light but may be adapted in accordance with principles well known in the art for detecting radiant energy of other wavelengths. And, of course, semiconductors other than silicon can be used.

Still further, for those applications in which the rectifying barrier need not inject minority carriers, e.g., in image sensing applications, the rectifying barrier need not be a PN junction but may be a Schottky-barrier or any other means suitable for collecting minority carriers released from the surface inversion layers.

Still further, although the junctions described hereinabove have been indicated as including relatively heavily doped material on one side, i.e., $PN^+$ junctions, this is of course not necessary to the practice of my invention. Resistivities may be adjusted in accordance with the principles described hereinabove for operation of the ILETs and, additionally, in accordance with junction capacitance and series resistance considerations well known in the art.

What is claimed is:

1. Semiconductor apparatus comprising:

a semiconductor body having a plurality of elongated, mutually parallel rectifying barriers included therein and spaced within a minority carrier diffusion length of a major surface thereof;

an insulating layer overlying and contiguous with the major surface of the body, said layer being relatively thick except for a plurality of localized relatively thin portions which are disposed in rows and columns such that each column overlies a common rectifying barrier;

means forming a plurality of row conduction paths disposed over the insulating layer and extending substantially orthogonally with respect to the rectifying barriers, a separate one of the row conduction paths overlying the thin insulating portions of each row;

means for applying voltages to the row conduction paths sufficient to induce nonequilibrium depletion regions under the thin insulating portions;

means for generating and storing charge carriers in a plurality of the depletion regions;

means for reverse-biasing the rectifying barriers; and means for collapsing the depletion regions under individual ones of the row conduction paths while maintaining the depletion regions under the other row conduction paths and for simultaneously maintaining the reverse bias upon the rectifying barriers so that the charge carriers are released by the collapsing depletion regions and are collected by the underlying rectifying barriers.

2. Apparatus as recited in claim 1 wherein the rectifying barriers are PN junctions.

3. Semiconductor apparatus comprising a semiconductor wafer including:

a semiconductive bulk portion of a first type semiconductivity;

a plurality of elongated substantially parallel zones, each of substantially greater length than width and each of a second type semiconductivity disposed in the bulk portion and forming a corresponding plurality of PN junctions therewith;

a layer of the first type semiconductivity disposed over and contiguous with the bulk portion such that the surface of the layer is a surface of the wafer and such that the thickness of the layer is less than a diffusion length for minority carriers in the layer;

means including said layer of first conductivity type forming a plurality of Metal-Insulator-Semiconductor devices disposed in rows and columns over the elongated zones such that the layer provides a common semiconductive portion for each of the Metal-Insulator-Semiconductor devices, each column of devices being disposed over a common one of the zones;

a plurality of means forming row conduction paths substantially orthogonally to the elongated zones, each of which paths provides a common electrical contact to the metal portion of each Metal-Insulator-Semiconductor device in a given row;

a plurality of low resistance electrical contacts, separate ones providing low resistance contact to separate ones of the elongated zones; and a separate electrical contact to the semiconductive portion of the first type semiconductivity.

4. Apparatus as recited in claim 3 wherein the plurality of Metal-Insulator-Semiconductor devices includes:

an insulating layer overlying and contiguous with the surface of the wafer, said insulating layer including relatively thick portions and a plurality of relatively thin portions, each thin portion providing the insulating portion of one of the Metal-Insulator-Semiconductor devices; and a plurality of spaced localized metallic regions, each overlying and being contiguous with a separate one of the thin insulating portions and each providing the metallic portion of one of the Metal-Insulator-Semiconductor devices.

5. Apparatus as recited in claim 4 wherein each of the plurality of conduction paths is at least semitransparent and each of the plurality of spaced localized metallic regions is at least semitransparent.

6. Apparatus as recited in claim 3 wherein the semiconductive portion of the Metal-Insulator-Semiconductor portion is electrically and physically common with the semiconductive material comprising one side of the PN junctions.

7. Apparatus as recited in claim 3 wherein the semiconductive portion of the Metal-Insulator-Semiconductor portion comprises a semiconductive layer, which layer also constitutes the semiconductive material comprising one side of the PN junctions.

8. Apparatus as recited in claim 7 wherein the layer is at least as thick as an absorption length for visible light.

9. Apparatus as recited in claim 8 wherein the layer is of thickness between about 1 and 25 microns.

10. Apparatus as recited in claim 3 further comprising:

means for applying a first voltage between the zones and the semiconductive material of the first type conductivity sufficient to reverse bias the PN junctions;

means for applying a second voltage to a plurality of the row conduction paths sufficient to form depletion regions completely through the layer under each of the Metal-Insulator-Semiconductor structures connected to said plurality of row conduction paths, such that a "write 0" operation is accomplished;

means for applying a third voltage to one of the row conduction paths and for removing the first applied voltage from at least one of the PN junctions, the third voltage being of greater magnitude than the second voltage and being sufficiently large to indirectly forward bias that portion of said at least one PN junction underlying said one row conduction path sufficiently that minority carriers are injected by said portion of said at least one PN junction across the layer and are accumulated at the semiconductor-insulator interface opposite said portion of the PN junction; and means for removing said third voltage and for reapplying said second voltage to said one row conduction path and for reapplying said first voltage to said at least one PN junction, such that a "write 1" operation is accomplished.

11. A method of operating in the Base Depletion Mode apparatus of the type including a semiconductor body having a plurality of elongated, mutually parallel rectifying barriers, included therein and spaced within a minority carrier diffusion length of a major surface thereof; an insulating layer overlying and contiguous with the major surface of the body, said layer being relatively thick except for a plurality of localized, relatively thin portions disposed in rows and columns such that each column overlies a common rectifying barrier; a plurality of means forming row conduction paths disposed over the insulating layer and extending substantially orthogonally with respect to the rectifying barriers such that a separate one of the row conduction paths overlies the thin insulating portions of each row; the method comprising the steps of:

applying a first voltage of polarity and magnitude sufficient to reverse bias a plurality of the rectifying barriers;

applying a second voltage to a plurality of the row conduction paths sufficient to form nonequilibrium depletion regions extending from the surface to the rectifying barrier thereunder, such that a "write 0" operation is accomplished;

applying a third voltage to one of said plurality of row conduction paths and removing the first applied voltage from at least one of the rectifying barriers, the third voltage being of greater magnitude than the second voltage and being sufficiently large to indirectly forward bias that portion of said at least one rectifying barrier underlying said row conduction path such that minority carriers are injected by said portion of said at least one rectifying barrier through said nonequilibrium depletion region and are accumulated at the semiconductor-insulator interface; and removing said third voltage;

reapplying said second voltage to said one row conduction path; and reapplying said first voltage to said at least one rectifying barrier, such that a "write 1" operation is accomplished.

12. A method as recited in claim 11 further comprising the steps of:

removing said second voltage from one of said row conduction paths while maintaining said first voltage across said plurality of rectifying barriers so that minority carriers accumulated in the depletion regions under said one row conduction path are released from the semiconductor-insulator interface and are collected by said rectifying barriers; and detecting the carriers collected by each of said rectifying barriers, such that a word-organized read-out is accomplished.

13. A method of operating as an image sensor apparatus of the type including a semiconductor body having a plurality of elongated, mutually parallel rectifying barriers included therein and spaced within a minority carrier diffusion length of a major surface thereof; an insulating layer overlying and contiguous with the major surface of the body, said layer being relatively thick except for a plurality of localized, relatively thin portions disposed in rows and columns such that each column overlies a common rectifying barrier; means forming a plurality of row conduction paths disposed over the insulating layer and extending substantially orthogonally with respect to the rectifying barriers such that a separate one of the row conduction paths overlies the thin insulating portions of each row; the method comprising the steps of:

applying a first voltage of polarity and magnitude sufficient to reverse bias a plurality of the rectifying barriers;

applying a second voltage to a plurality of row conduction paths sufficient to form nonequilibrium depletion regions thereunder adjacent the surface of the semiconductor body and extending less than the distance to the rectifying barriers thereunder;

exposing the apparatus to radiant energy of wavelength and intensity sufficient to generate hole-electron pairs in and near said depletion regions;

removing the second voltage from one of said row conduction paths while maintaining the reverse bias on said plurality of rectifying barriers in a manner sufficient that photogenerated minority carriers are released from the semiconductor-insulator surface under said one row of conduction path and so that said released minority carriers are collected by the underlying rectifying barriers; and detecting separately the minority carriers collected by at least one of the rectifying barriers.

* * * * *